US010969687B2

(12) United States Patent
Wang et al.

(10) Patent No.: US 10,969,687 B2
(45) Date of Patent: Apr. 6, 2021

(54) METHOD FOR FORMING PATTERNS

(71) Applicant: UNITED MICROELECTRONICS CORP., Hsin-Chu (TW)

(72) Inventors: Harn-Jiunn Wang, Kaohsiung (TW); Kai-Ming Liu, Tainan (TW); Chin-Lung Lin, Hsinchu (TW); Yi-Hsiu Lee, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 86 days.

(21) Appl. No.: 16/209,871

(22) Filed: Dec. 4, 2018

(65) Prior Publication Data
US 2019/0187562 A1 Jun. 20, 2019

(30) Foreign Application Priority Data
Dec. 18, 2017 (CN) .......................... 201711364263.0

(51) Int. Cl.
*G03F 7/20* (2006.01)
*H01L 21/3213* (2006.01)
*H01L 21/027* (2006.01)

(52) U.S. Cl.
CPC ............ *G03F 7/2022* (2013.01); *G03F 7/203* (2013.01); *H01L 21/027* (2013.01); *H01L 21/0274* (2013.01); *H01L 21/3213* (2013.01)

(58) Field of Classification Search
CPC .................................................... G03F 7/2022
See application file for complete search history.

(56) References Cited

U.S. PATENT DOCUMENTS

| 9,287,300 | B2 | 3/2016 | Kim |
| 2010/0035192 | A1 | 2/2010 | Ando |
| 2010/0112463 | A1* | 5/2010 | Yune .................. G03F 7/70466 430/5 |
| 2013/0129991 | A1 | 5/2013 | Ndoye |
| 2014/0065556 | A1* | 3/2014 | Oori ........................ G03F 7/203 430/325 |
| 2016/0081187 | A1 | 3/2016 | Mori |

FOREIGN PATENT DOCUMENTS

CN 1393906 A 1/2003

* cited by examiner

*Primary Examiner* — Kathleen Duda
(74) *Attorney, Agent, or Firm* — Winston Hsu

(57) ABSTRACT

A method for forming patterns is provided in the present invention. The process includes the steps of using a first mask to perform a first exposure process to a photoresist, using a second mask to perform a second exposure process to the photoresist, wherein the corners of the second opening patterns in the second mask and the corners of the first opening patterns in the first mask overlap each other, and performing a development process to remove the unexposed portions of the photoresist in the two exposure processes to form staggered hole patterns therein.

5 Claims, 4 Drawing Sheets

METHOD FOR FORMING PATTERNS

BACKGROUND OF THE INVENTION

1. Field of the Invention

The present invention generally relates to a semiconductor process for forming hole patterns, and more specifically, to a semiconductor process adopting litho-litho-etch (LLE) double patterning scheme to form hole patterns.

2. Description of the Prior Art

As the semiconductor technology progresses and the application field of memory devices becomes wider and wider, the manufacture of high-capacity memory devices requires higher circuit integration, at the same time, without degrading the electrical property of the devices. For this requirement, many researches about improving current photolithography processes, memory cell structures and their physical properties are in full swing.

When the dimension of a contact hole is below 50 nm, it is very difficult to define microscopic contact hole patterns through current single ArF laser exposure processes, even by adopting an immersion lithography process. Therefore, in current industry, contact hole patterns are usually defined and formed by adopting a double patterning process, such as litho-litho-etch (LLE) process, litho-freeze-litho-etch (LFLE) process, or self-aligned double patterning (SADP) process, in order to define feature patterns having a resolution beyond current photolithographic limits without the use of advanced photolithography tools, such as EUV photolithography tools.

SUMMARY OF THE INVENTION

What the present invention discloses is an improved litho-litho-etch (LLE) semiconductor patterning process used specifically for forming staggered hole patterns, such as contact hole patterns densely arranged in memory devices.

The objective of the present invention is to provide a method for forming patterns, including the steps of: providing a photoresist; performing a first exposure process using a first photomask to the photoresist, wherein the first photomask is provided with first opening patterns in an array; performing a second exposure process using a second photomask to the photoresist, wherein the second photomask is provided with second opening patterns in an array, and each corner of the second opening patterns overlaps each corner of the first opening patterns; and performing a development process to remove portions of the photoresist unexposed in the first exposure process and the second exposure process, so that staggered hole patterns are formed in the photoresist.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
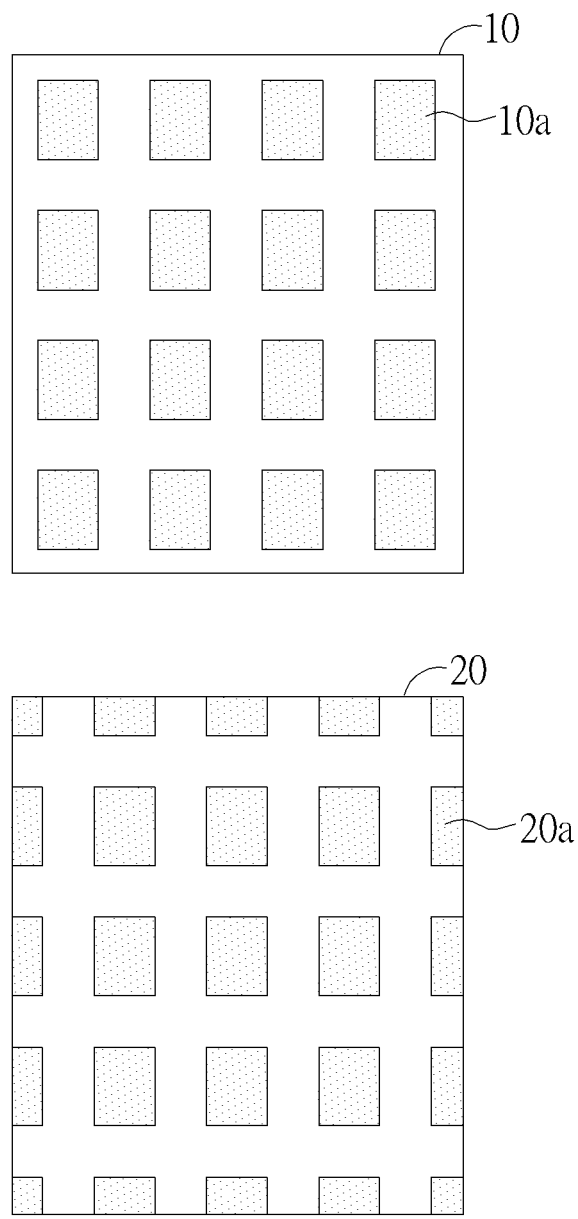
FIG. 1 is a top view illustrating the rectangular opening patterns in a first photomask and a second photomask in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer to FIG. 1 first, wherein a top view illustrating rectangular opening patterns in a first photomask and a second photomask according a preferred embodiment of the present invention is illustrated. The present invention discloses a litho-litho-etch (LLE) method for forming patterns, wherein two photomasks (referred hereinafter as first photomask 10 and second photomask 20 respectively) are adopted in the method to perform an exposure process to the same photoresist and obtain the desired patterns in the photoresist. The first photomask 10 and the second photomask 20 are both provided with predetermined rectangular opening patterns, which are denoted respectively as 10a and 20a distributed on the photomask plane in regular arrangement in the figure. Please note that, although the first photomask 10 and the second photomask 20 in the figure are provided with identical rectangular opening patterns and arrangement, the rectangular opening patterns are staggered and may have different dimensions. These features may be more understanding with reference to later figures.

Figure 2:
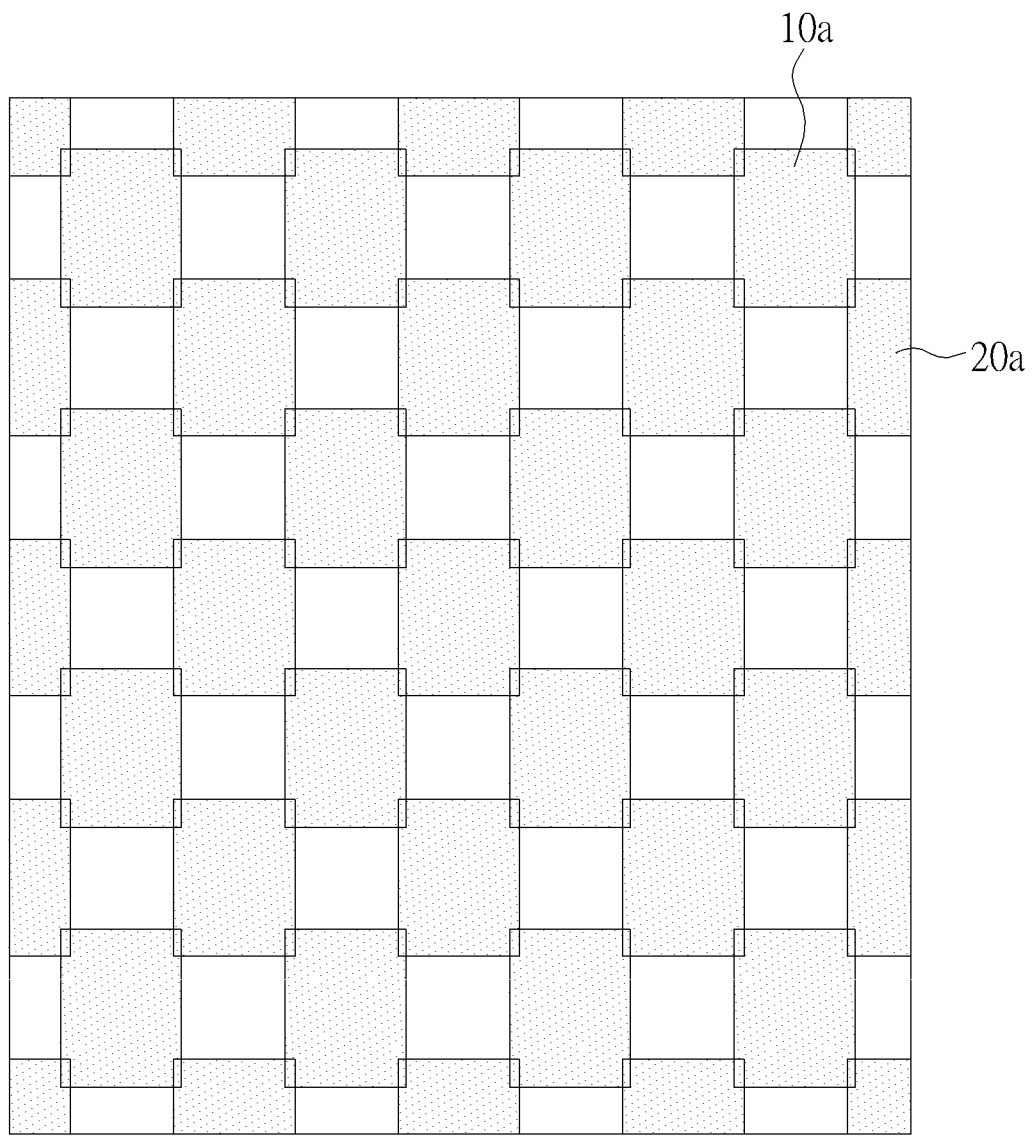
FIG. 2 is a top view illustrating the overlapped rectangular opening patterns of the first photomask and the second photomask in accordance with one embodiment of the present invention.

Please refer to FIG. 2 now. FIG. 2 is a top view illustrating the overlapped rectangular opening patterns 10a and 20a of the first photomask 10 and the second photomask 20 in accordance with one embodiment of the present invention. It can be seen in the figure that the rectangular opening patterns 10a and 20a of the first photomask 10 and the second photomask 20 have the same dimensions. However, since the relative positions of rectangular opening patterns 10a and 20a are shifted and staggered, each corner of the rectangular opening patterns 10a would overlap each corner of the rectangular opening patterns 20a. Therefore, there will be regions defined between the rectangular opening patterns 10a and 20a that would not be exposed in actual exposure processes.

Figure 3:
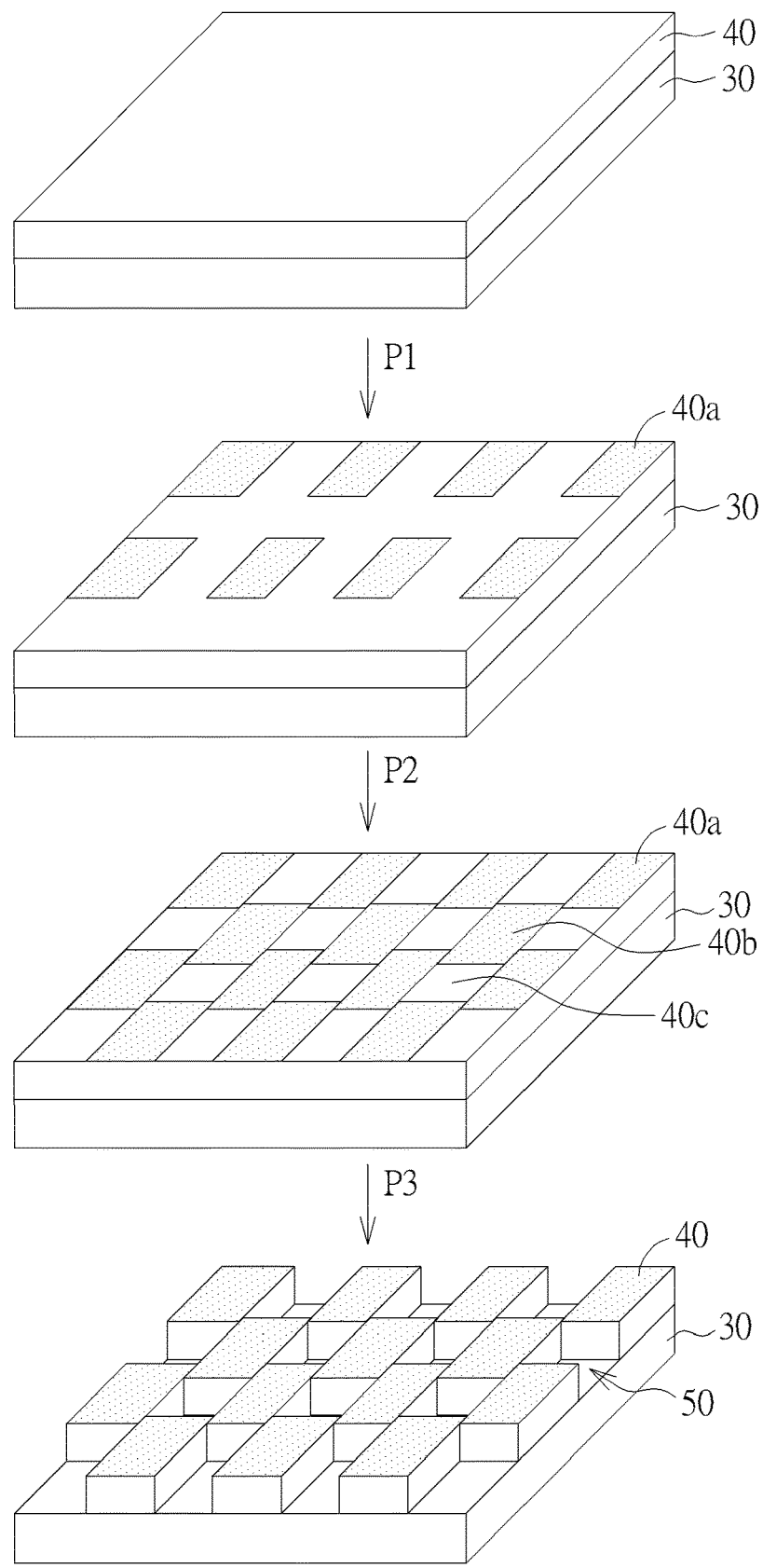
FIG. 3 is a perspective view illustrating the photoresist during the two exposure processes and the development process in accordance with one embodiment of the present invention.

Please refer to FIG. 3 now. FIG. 3 is a perspective view illustrating the resulting photoresist patterns after the exposure and development processes using the first photomask 10 and the second photomask 20 in accordance with one embodiment of the present invention. First, an etch target layer 30, such as a substrate, is provided. The etch target layer 30 may include various doped regions and active regions, depending on the practical design requirement and configurations in the art. Other semiconductor substrate, such as epitaxial silicon substrate, silicon-germanium (SiGe) substrate or silicon-on-insulator (SOI) substrate, may also be adopted. In other embodiments, for example, in a process of forming contact holes in memory devices, the etch target layer 30 may be a hard mask layer (e.g. an amorphous silicon layer) with an underlying dielectric layer (e.g. an interlayer dielectric, ILD) for accommodating contact structures to be formed therein, and may have components such as word lines and bit lines formed therein in advance.

Thereafter, a layer of photoresist 40 is coated on the etch target layer 30. The process of present invention adopts negative tone photoresist 40. A first exposure process P1 is then performed to the photoresist 40 by using the first photomask 10 to define the photoresist 40 with a first latent image, which is referred hereinafter as first exposure regions 40a. Subsequently, a second exposure process P2 is performed to the photoresist 40 by using the second photomask 20 to define the photoresist 40 with a second latent image, which is referred hereinafter as second exposure regions 40b.

As shown in FIG. 2, since each corner of the rectangular opening patterns 10a in the first photomask 10 is overlapped with each corner of the rectangular opening patterns 20a in the second photomask 20, the corners of first exposure regions 40a and the corners of second exposure regions 40b defined in the photoresist 40 would also overlap each other after the first exposure process P1 and the second exposure process P2. Therefore, the unexposed regions 40c that are not exposed in the two exposure processes are defined in the photoresist 40.

Subsequently, a development process P3 is performed to the exposed photoresist. In this process, since the adopted photoresist 40 is negative photoresist, the internal composition of the photoresist would be cross-linked and polymerized after exposed to UV light, so that it would become insoluble in the developer solution. Therefore, the exposed portions of the negative photoresist would remain in the development process, while the unexposed portions would be dissolved. In the present invention, the property of the photoresist and the exposure energy are properly controlled, so that it may be cross-linked and cured by only one-time exposure. Therefore, the development process P3 may remove the portions of unexposed regions 40c in the photoresist 40 in the two exposure processes, so that the rectangular opening patterns 50 would be formed in a staggered arrangement as shown in the figure. The development process P3 may go with a curing process to achieve better outcome.

Figure 4:
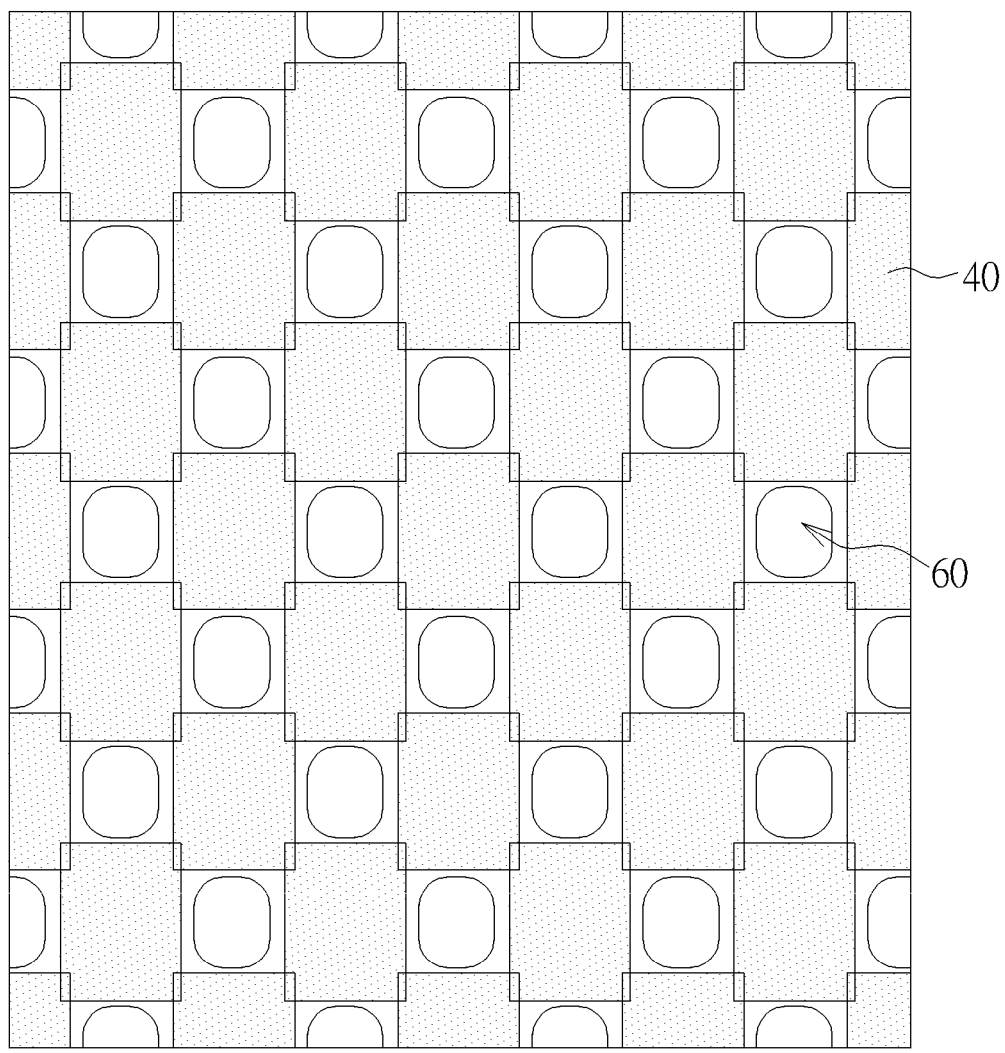
FIG. 4 is a top view illustrating actual resulting photoresist patterns after the exposure processes and the development process using the first photomask and the second photomask to the photoresist in accordance with one embodiment of the present invention.

Although the final developed pattern is shaped in the form of rectangular openings as shown in FIG. 3, it should be noted that, in practice, the resulting opening pattern would be corner rounded into the desired hole patterns as shown in FIG. 4 after the development, wherein each hole pattern 60 is defined by two first rectangular opening patterns 10a and two second rectangular opening patterns 20a.

After the hole patterns 60 are formed in the photoresist 40, an etch process is then performed to the etch target layer 30 using the photoresist 40 as an etch mask, so as to transfer the hole patterns 60 in the photoresist 40 into the etch target layer 30. The etch target layer 30 with defined hole patterns 60 is then used as a hard mask to perform an etch process again to transfer the hole patterns 60 into the underlying ILD layer (not shown), so that staggered contact hole structures may be formed in the ILD layer. Since the ILD layer and the contact holes are not essential technical features of the present invention, they will not be shown in the figures for the simplicity of drawings.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming patterns, comprising:

providing a photoresist;

performing a first exposure process using a first photomask to said photoresist, wherein said first photomask is provided with first opening patterns in an array, and portions of said photoresist overlapping said first opening patterns are exposed in said first exposure process, and the other portions of said photoresist not overlapping said first opening patterns are unexposed in said first exposure process;

performing a second exposure process using a second photomask to said photoresist, wherein said second photomask is provided with second opening patterns in an array, and each corner of said second opening patterns overlaps each corner of said first opening patterns, and portions of said photoresist overlapping said second opening patterns are exposed in said second exposure process, and the other portions of said photoresist not overlapping said second opening patterns are unexposed in said second exposure process; and performing a development process to remove portions of said photoresist unexposed both in said first exposure process and in said second exposure process, so that staggered hole patterns are formed in said photoresist.

2. The method for forming patterns of claim 1, wherein said photoresist is negative photoresist.

3. The method for forming patterns of claim 1, wherein each said hole pattern is defined by two said first opening patterns and two said second opening patterns.

4. The method for forming patterns of claim 1, further comprising performing an etch process using said developed photoresist as an etch mask to an underlying substrate.

5. The method for forming patterns of claim 1, wherein said hole patterns are contact hole patterns.

* * * * *